United States Patent
El Euch et al.

(10) Patent No.: US 11,651,266 B2
(45) Date of Patent: *May 16, 2023

(54) QUANTUM RANDOM ACCESS MEMORY SYSTEM

(71) Applicant: Abu Dhabi University, Abu Dhabi (AE)

(72) Inventors: Hichem El Euch, Abu Dhabi (AE); Mohammed Abdellatif Abdelaal Zidan, Assult (EG); Abdulhaleem Mohamed Ahmed Abdelaty, Bisha (SA); Mahmoud Mohamed Ahmed Abdel-Aty, Giza (EG); Ashraf Khalil, Abu Dhabi (AE)

(73) Assignee: Abu Dhabi University, Abu Dhabi (AE)

( * ) Notice: Subject to any disclaimer, the term of this patent is extended or adjusted under 35 U.S.C. 154(b) by 0 days.

This patent is subject to a terminal disclaimer.

(21) Appl. No.: 17/402,620

(22) Filed: Aug. 16, 2021

(65) Prior Publication Data

US 2022/0067564 A1 Mar. 3, 2022

Related U.S. Application Data

(63) Continuation of application No. 17/002,782, filed on Aug. 26, 2020, now Pat. No. 11,093,850.

(51) Int. Cl.
*G06N 10/00* (2022.01)

(52) U.S. Cl.
CPC .................. *G06N 10/00* (2019.01)

(58) Field of Classification Search
CPC ...................................... G06N 10/00
See application file for complete search history.

(56) References Cited

U.S. PATENT DOCUMENTS

| | | | |
|---|---|---|---|
| 6,987,402 B2* | 1/2006 | Lee | H03K 19/1736 326/136 |
| 10,637,480 B1* | 4/2020 | Hu | H03K 19/195 |
| 10,860,759 B2* | 12/2020 | Roetteler | G06F 30/327 |
| 2020/0193072 A1* | 6/2020 | Johansson | G06F 7/722 |
| 2020/0311594 A1* | 10/2020 | Gidney | G06F 7/505 |

* cited by examiner

*Primary Examiner* — Kurtis R Bahr (57) ABSTRACT

A quantum circuit, including, a first S gates, a first Toffoli gate, a Controlled-SWAP gates, a Controlled-Toffli gates, a second Toffoli gate, and a second S gates.

13 Claims, 6 Drawing Sheets

FIG. 1

| Item | Size (qubits) ← 204 | Description ← 206 |
|---|---|---|
| $\lvert A\rangle$ | n | Used to address 2n locations is the $\lvert D\rangle$ register |
| $\lvert D\rangle$ | m, (where $n \leq m$, or $m \leq n$) | Used to store the data |
| $\lvert dq\rangle$ | 1 | Used to mark the the designated location/address |
| $\lvert qy\rangle$ | n+m | Used to carray the designated location/address and the value which we need to read from/write into QRAM. |
| $\lvert r\rangle$ | 1 | Used to decide if the running operation ($\lvert r\rangle=\lvert 1\rangle$) is reading operation or writing operation($\lvert r\rangle=\lvert 0\rangle$). |

QUANTUM RANDOM ACCESS MEMORY SYSTEM

BACKGROUND

Due to the increased demand for quantum computing devices and applications, quantum random access memory (RAM) systems are becoming increasingly important. RAM systems are used for short term memory whereby any storage location in the RAM can be accessed. Various applications of quantum computing include quantum computers, quantum communications, quantum artificial intelligence, quantum teleportation, and other quantum technologies. Currently, there is no effective RAM systems can be used for quantum computers and the mentioned application.

DETAILED DESCRIPTION OF PREFERRED EMBODIMENTS

The following detailed description refers to the accompanying drawings. The same reference numbers in different drawings may identify the same or similar elements.

Systems, devices, and/or methods described herein may provide for a quantum circuit design used within a quantum random access memory ("QRAM") device. In embodiments, the quantum circuit design described herein may use universal gates and is not restricted to a particular quantum system. In embodiments, universal gates may include CNOT, NOT, control swap, Toffoli gates, and Hadamard gates. In embodiments, the quantum circuit design is more accurate in transferring information across the quantum circuit design. In embodiments, the quantum circuit design requires only a O(1) call to access a particular location rather than O(N) calls. Accordingly, in embodiments, the quantum circuit design results in faster calculations due to requiring only a O(1) call. Thus, the systems, devices, and/or methods described herein provide for a quantum circuit design that is faster in reading or writing information, has lower levels of error when information is sent across the quantum circuit design, and capable of using universal gates that allows for use of the quantum circuit design in various different quantum systems. Thus, embodiments, the quantum circuit design, described herein, may be used in a quantum RAM system which is faster in reading and writing information with less errors. In embodiments, while the proposed QRAM may be used in a quantum computer, the QRAM can also be used for a classical computer. In embodiments, by using the circuit design in a classical computer, the capacity of RAM can be increased from m GB to $2^m$ GB.

Figure 1:
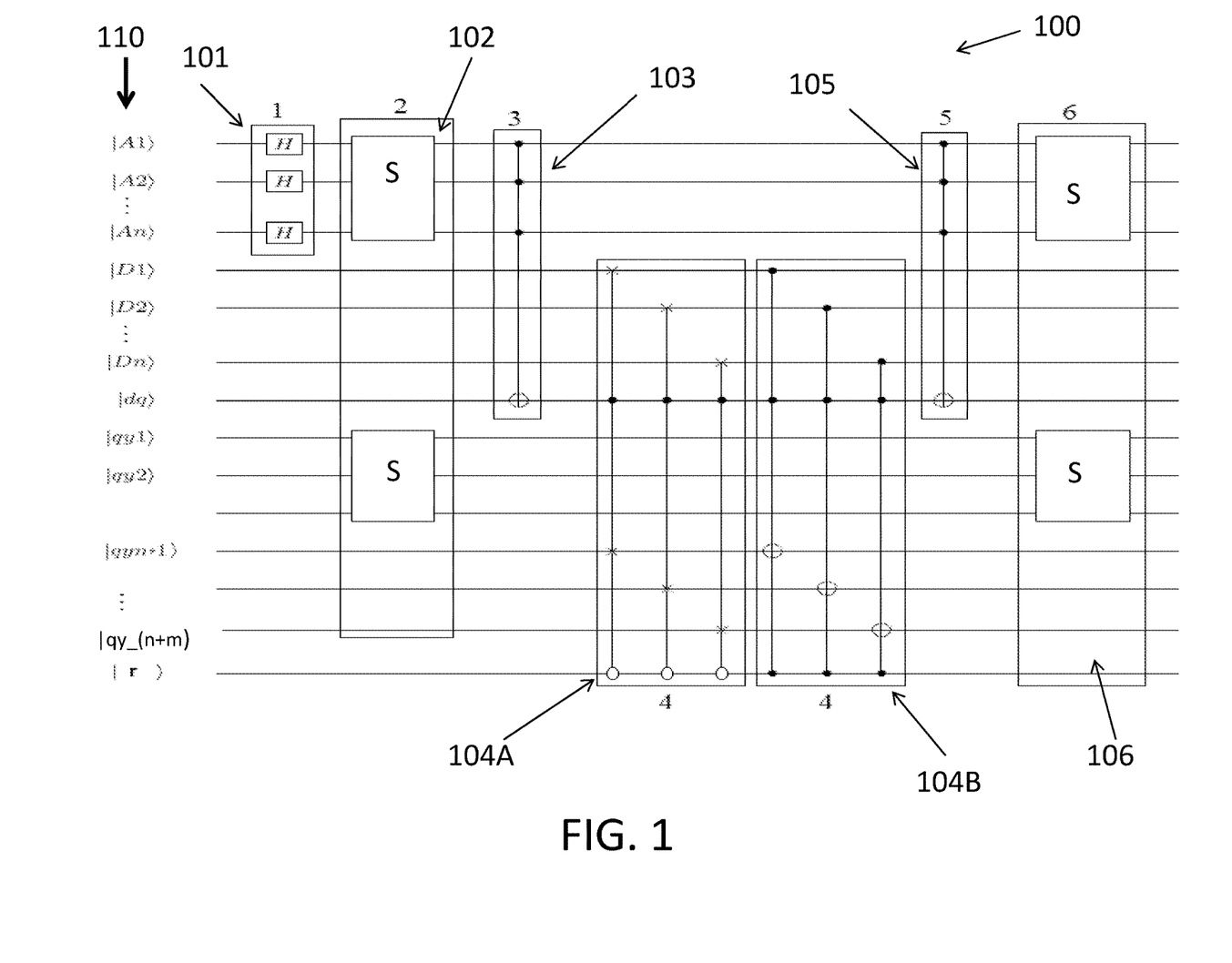
FIG. 1 is an example of the proposed quantum circuit for the proposed QRAM.

FIG. 1 describes an example structure of the proposed QRAM circuit 100. In embodiments, circuit 100 includes Hadamard gates 101, S gates 102, Toffoli gate 103, gates 104A, gates 104B, Toffoli gate 105, and S gates 106. In embodiments, circuit design 100 may be a main quantum circuit for a proposed QRAM. In embodiments, Hadamard gates 101 may include n (n greater or equal to 1) Hadamard gates which aretype of quantum—gate which can act on a single qubit (quantum bit) where for each address qubit in the register |A> there is a Hadamard gate. In embodiments, Hadamard gates 101 may be a one-qubit version of a quantum Fourier transform. In embodiments, S gates 102 and 106 may be a quantum circuit auxiliary operator that is composed of one or more CNOT gates and a quantum X-gate. In embodiments, S gates 102 and 106 may include a set of n CNOT gates and n quantum-NOT gates. In embodiments, one or more CNOT gates in S gates 102 and 106 may act as a two qubit gate.

Figure 2:
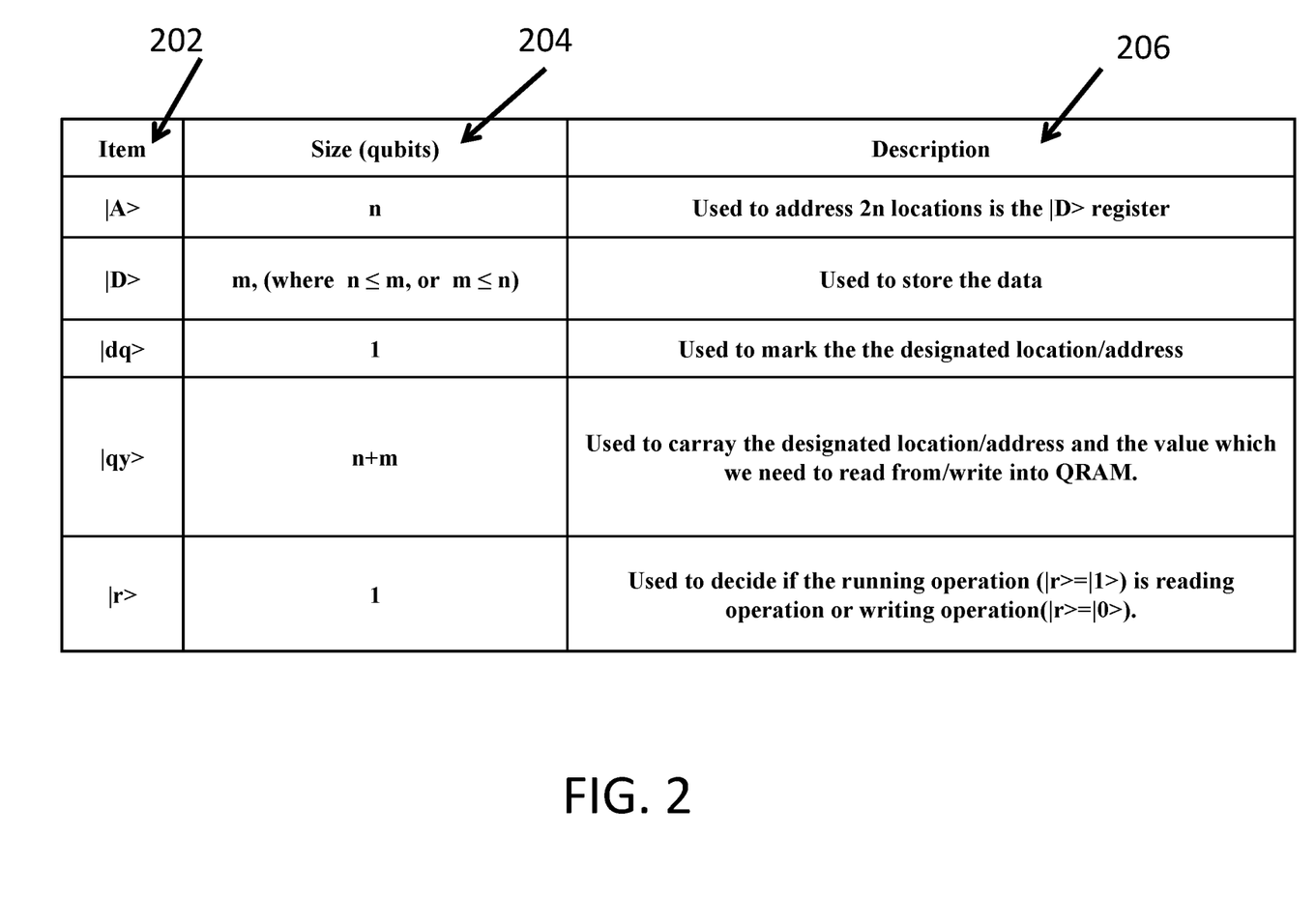
FIG. 2 is a diagram of quantum registers.

In embodiments, Toffoli gates 103 and 105 are reversible quantum gates. As shown in FIG. 2, gate 104A contains controlled SWAP gates and gate 104B contains Toffoli gates. In embodiments, controlled-SWAP gates perform controlled two-qubit swap, this gate swaps the states of the qubits which has indices n+1, ..., n+m of the register |qy> with the states of register |D> if the state of the control-qubit |r>=|0> and the state of the control-qubit |dq>=1. In embodiments, S gates 106 can be used to undo the effect of S gates 102.

FIG. 2 shows an example information table that describes various features of circuit 100. As shown in FIG. 2, item 202 describes different registers that are shown in column 110 of FIG. 1. In embodiments, Register |A> is an address register which is used to address the locations of register |D>. Thus, register |A> represents the addresses of the locations of the variables in a quantum RAM (QRAM). In embodiments, |A> with the size of "n" qubits and is used to address $2^n$ locations in the |D> register. In embodiments, |D> is with m qubits (where n≤m, or m≤n) and is used to store data. In embodiments, |dq> has only one qubit and is used to mark a designated location/address. In embodiments, |dq> may be initialized by state 10>. In embodiments, |qy> may have a qubit size of n+m and is used to carry the designated location/address and value needed to read from/write into QRAM. In embodiments, the first n qubits of register |qy> are used to carry the address of variable location(s) provided by a quantum computer (or quantum circuit/device) while the other m qubits are used to carry the value in the variable to transfer it to a specific location in the quantum RAM ("QRAM") or used to read the data from the QRAM. In embodiments, |r> composed by only one qubit and it is used to decide if the running operation (|r>=11>) is a reading operation being conducted in the QRAM or a writing operation (|r>=10>) is being conducted in the QRAM (e.g., across circuit design 100).

Figure 3:
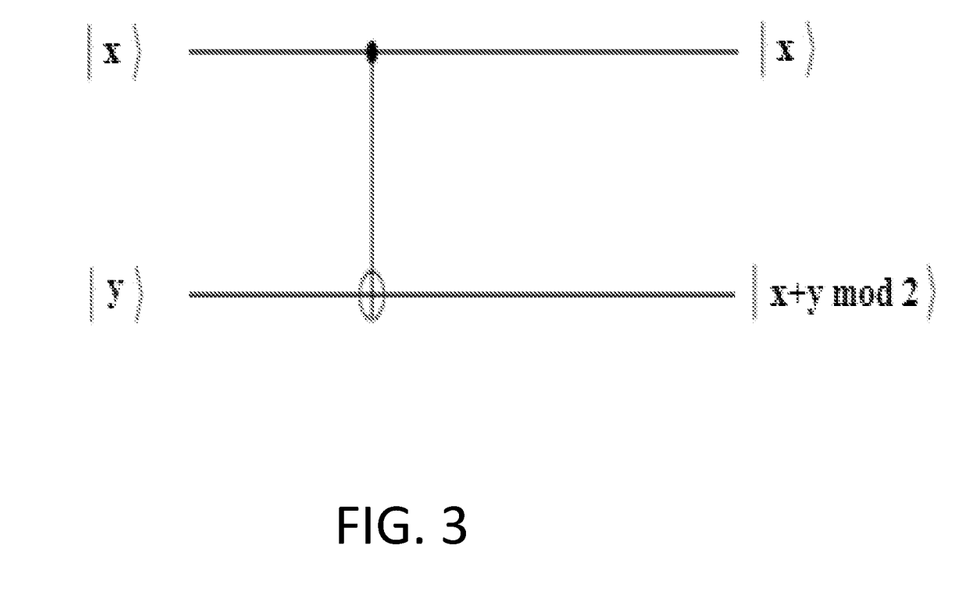
FIG. 3 is a diagram of an example quantum CNOT gate.

FIG. 3 shows an example CNOT gate. In embodiments, |x> qubit is a control qubit and |y> is a target qubit. In embodiments, CNOT gate negates the state of the target qubit if the state of the control qubit is |1>.

In embodiments, using the proposed circuit, of the proposed QRAM, 100, an algorithm is applied by Hadamard gates 101, wherein each of the Hadamard gates 101 is applied to a single qubit of register |A> to address $2^n$ locations in the QRAM. Next, when an address is loaded in the first n-qubit of register |qy>, S gates 102 searches about this address in the QRAM. Thus, circuit 100 uses S gates 102 to find the address location, among $2^n$ addresses of register |A> which is then assigned by a quantum processor by first n qubits of the register |qy>. In embodiments, S gates 102 is composed by C-NOT gates followed by Quantum X-gates. For example, S102 is composed of a set of n CNOT gates and n quantum NOT gates (X gates). In embodiments, CNOT gates act as two qubit gates.

Figure 4:
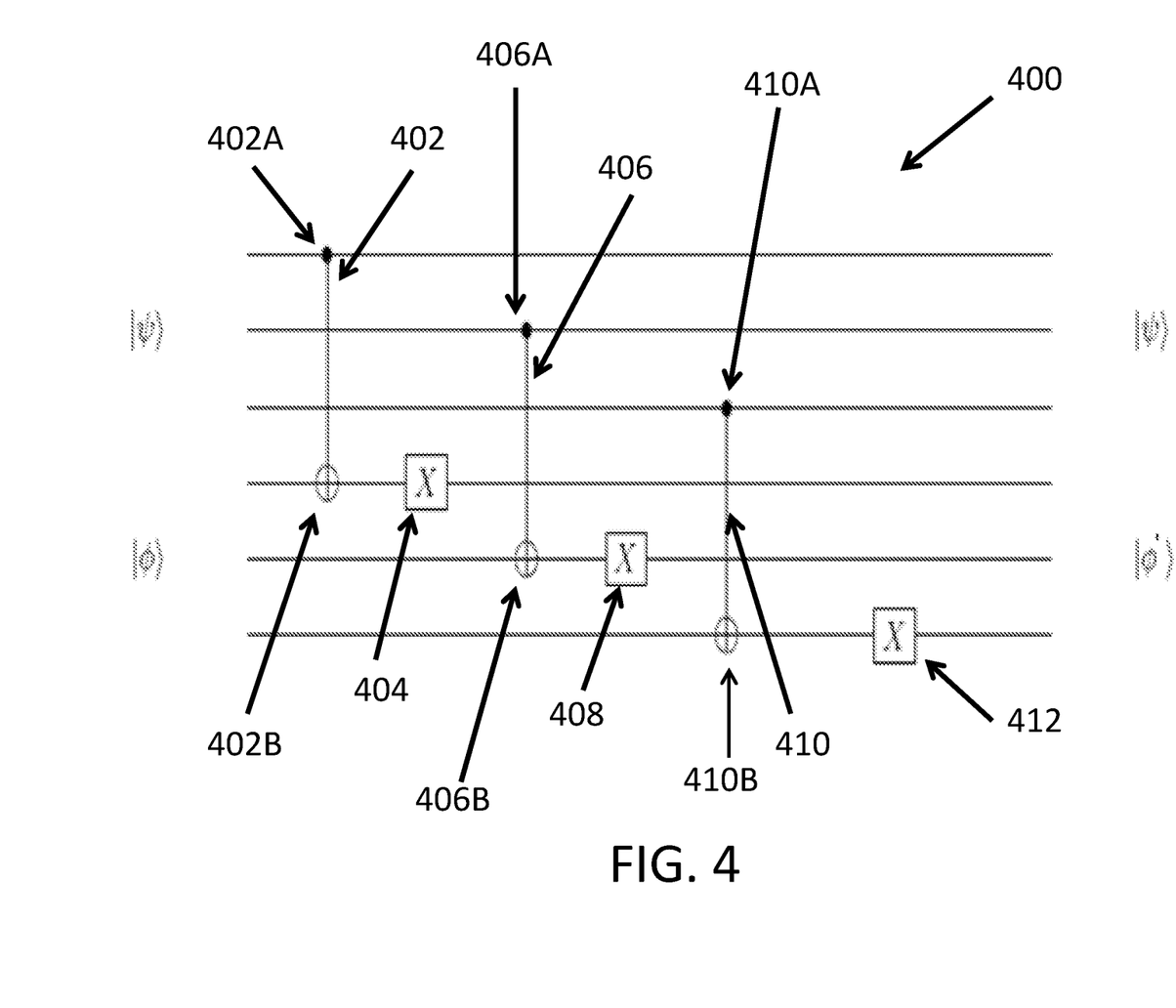
FIG. 4 is a diagram of example elementary gates for S Operator.

An example S gates 400 is shown in FIG. 4. In embodiments, S gates 400 are similar to S gates 102, and/or S gates 106. In embodiments, FIG. 4 shows the structure of an Operator S. In FIG. 4, |ψ⟩ represents the first n qubits of the register |qy⟩ in FIG. 1 and |φ⟩ represents the n qubits of the registers |A⟩. As shown in FIG. 4, operation 402 may show a qubit that negates (402B) if the state of the control qubit (402A) is |1⟩. In embodiments, X-gate 404 then negates the states of the qubit. As shown in FIG. 4, operation 406 may show a second qubit that negates (406B) if the state of the control qubit (406A) is |1⟩. In embodiments, X-gate 408 then negates the second qubit. Furthermore, as shown in FIG. 4, operation 410 may show a third qubit that negates (410B) if the state of the control qubit (410A) is |1⟩. In embodiments, X-gate 412 then negates the third qubit and any additional qubits.

After S gates 102, Toffli gate 103 is used to mark the address which matches the input address in register |qy⟩ by entangling |dq⟩ with this address to mark this address in the superposition. In embodiments, Toffli gate 103 is defined as $$T_{A_1A_2\ldots A_nd_q}{}^n = |A_1A_2\ldots A_nd_q,(A_1A_2\ldots A_n+d_q) \bmod 2\rangle$$

After Toffoli gate 103, either controlled-SWAP gates 104A or Toffoli gates 104B are applied. The algorithm does the reading process from the given location provided by the quantum processor/microcontroller/quantum circuit through the first nth qubits of register |qy⟩. If the qubit |r⟩ is loaded with state |1⟩ by the quantum processor/microcontroller/quantum circuit then the Toffli gates 104B are running to make a decoupled copy of the value of the variable to the last m qubits of register |qy⟩. Meanwhile, the controlled-SWAP gates are not working, and the reading process is done. On the other hand, if the quantum processor (e.g., microcontroller, quantum-circuit, etc.) loads the state |0⟩ to the qubit |r⟩, consequently, the Controlled-SWAP gates 104A are running to write the value stored in the last m qubits of the register |qy⟩ into QRAM location specified by the first n qubits. Meanwhile, Toffoli gates 104B are not working as the writing process is being conducted.

After SWAP gates 104A and Toffoli gates 104B, Toffli gate 105 removes the marking entangled over qubit |dq⟩ by applying Toffoli gate 105 to make it disentangled. After Toffli gate 105, S gates 106 undoes the effect of S gates 102 by applying S gates 106 once again to make the QRAM ready to next read/write process, where S gates 106 is applied.

In a first non-limiting example, the proposed QRAM, circuit 100 may be used to write a value [101] in a location/address |001⟩ and then reads the value from this location/address. In this non-limiting example, address initialization is conducted by applying three Hadamard gates to three qubits of register |A⟩ to create a complete superposition of states of the address register |A⟩ to address $2^3=8$ locations described by register |D⟩, in the QRAM (e.g., circuit 100). This is also shown by:

$$|\psi_0\rangle = H^{\otimes 3}|A\rangle \otimes I^{\otimes n}|D\rangle \otimes I|dq\rangle \otimes I^{\otimes 2n}|qy\rangle \otimes I|r\rangle$$

$$|\psi_0\rangle H^{\otimes 3}|000\rangle \otimes I^{\otimes n}|000\rangle \otimes I|0\rangle \otimes I^{\otimes 2n}|000000\rangle \otimes I|0\rangle =$$

$$\frac{1}{\sqrt{8}}(|000, 000, 0, 000\ 000, 0\rangle + |001, 000, 0, 000\ 000, 0\rangle +$$

$$|010, 000, 0, 000\ 000, 0\rangle + |011, 000, 0, 000\ 000, 0\rangle +$$

$$|100, 000, 0, 000\ 000, 0\rangle + |101, 000, 0, 000\ 000, 0\rangle +$$

$$|110, 000, 0, 000\ 000, 0\rangle + |111, 000, 0, 000\ 000, 0\rangle).$$

In this first non-limiting example, once the address initialization is conducted, QRAM (e.g., circuit 100) can conduct a writing operation. In this non-limiting example, the value |101⟩ is to be stored in location/address |001⟩. Thus, the first three qubits of register |qy⟩ are loaded with the target location in the QRAM (e.g., circuit 100) while loading the last three qubits with the value needed to store.

Thus, the state of the register |qy⟩ is |qy⟩=|001, 101⟩ and set the control qubit |r⟩ to state |0⟩ for the QRAM to perform writing operations. In this first non-limiting example, an S operator (e.g., S gate 102) is applied between the first three qubits of register |qy⟩ and register |A⟩ to search for the designated location/address. Thus, the S operation transfers the designated location/address to state |111⟩ as follows:

$$|\psi_0\rangle = \frac{1}{\sqrt{8}}(|000, 000, 0, 001\ 000, 0\rangle +$$

$$|001, 000, 0, 001\ 101, 0\rangle + |010, 000, 0, 001\ 101, 0\rangle +$$

$$|011, 000, 0, 001\ 101, 0\rangle + |100, 000, 0, 001\ 101, 0\rangle +$$

$$|101, 000, 0, 001\ 101, 0\rangle + |110, 000, 0, 001\ 101, 0\rangle +$$

$$|111, 000, 0, 001\ 101, 0\rangle).$$

$$|\psi_1\rangle = \frac{1}{\sqrt{8}}(|110, 000, 0, 001\ 101, 0\rangle + |111, 000, 0, 001\ 101, 0\rangle +$$

$$|100.000, 0, 001\ 101, 0\rangle + |101, 000, 0, 001\ 101, 0\rangle +$$

$$|010, 000, 0, 001\ 101, 0\rangle + |011, 000, 0, 001\ 101, 0\rangle +$$

$$|000, 000, 0, 001\ 101, 0\rangle + |001, 000, 0, 001\ 101, 0\rangle).$$

In this first non-limiting example, $T_{A_1A_2A_3dq}{}^3$ gate is applied (e.g., Toffoli gate 103) and negates the state of the qubit |dq⟩ only if the state of the address register |A⟩ is in the state |A⟩=|111⟩ as follows:

$$|\psi_2\rangle = \frac{1}{\sqrt{8}}(|110, 000, 0, 001\ 101.0\rangle + |111, 000, 1, 001\ 101, 0\rangle +$$

$$|100, 000, 0, 001\ 101, 0\rangle + |101, 000, 0, 001\ 101, 0\rangle +$$

$$|010, 000, 0, 001\ 101, 0\rangle + |011, 000, 0, 001\ 101, 0\rangle +$$

$$|000, 000, 0, 001\ 101, 0\rangle + |001, 000, 0, 001\ 101, 0\rangle).$$

In this first non-limiting example, $T_{rdqqy_{n+i}D_i}{}^3$ gate will not be applied (e.g., gate 104B) because the state of the qubit |r⟩ is |0⟩. However, the gate $C^0$–C–SW $AP_{rdqqy_{n+i}D_i}$ (i=1, 2, 3) (e.g. gate 104A) will apply as it is controlled by state |r⟩=|0⟩. Thus, the writing operation is executed since the Controlled-SWAP gate is applied to write the value stored in the last m qubits of the register |qy⟩ into a QRAM location specified by the first n qubits. Thus:

$$|\psi_3\rangle = \frac{1}{\sqrt{8}}(|110, 000, 0, 001\ 101, 0\rangle + |111, 101, 1, 001\ 000, 0\rangle +$$
$$|100, 000, 0, 001\ 101, 0\rangle + |101, 000, 0, 001\ 101, 0\rangle |010,$$
$$000, 0, 001\ 101, 0\rangle + |011, 000, 0, 001\ 101, 0\rangle +$$
$$|000, 000, 0, 001\ 101, 0\rangle + |001, 000, 0, 001\ 101, 0\rangle).$$

In this first non-limiting example, QRAM (e.g., circuit 100) may undo the effect of a previous gate (e.g., gate 104A) after the writing process is done by applying $T_{A_1A_2A_3dq}^3$ (e.g., Toffoli Gate 105) gate as follows:

$$|\psi_3\rangle = \frac{1}{\sqrt{8}}(|110, 000, 0, 001\ 101, 0\rangle + |111, 101, 0, 001\ 000, 0\rangle +$$
$$|100, 000, 0, 001\ 101, 0\rangle + |101, 000, 0, 001\ 101, 0\rangle +$$
$$|010, 000, 0, 001\ 101, 0\rangle + |011, 000, 0, 001\ 101, 0\rangle +$$
$$|000, 000, 0, 001\ 101, 0\rangle + |001, 000, 0, 001\ 101, 0\rangle).$$

In this first non-limiting example, the circuit undoes the effect of S gates 102 after the writing process is done by applying the S operator again (e.g., S gates 106). Thus:

$$|\psi_5\rangle = \frac{1}{\sqrt{8}}(|000, 000, 0, 001\ 101, 0\rangle + |001, 101, 0, 001\ 000, 0\rangle +$$
$$|010, 000, 0, 001\ 101, 0\rangle + |011, 000, 0, 001\ 101, 0\rangle +$$
$$|100, 000, 0, 001\ 101, 0\rangle + |101, 000, 0, 001\ 101, 0\rangle +$$
$$|110, 000, 0, 001\ 101, 0\rangle + |111, 000, 0, 001\ 101, 0\rangle).$$

In this first non-limiting example, the state of registers |A, D⟩ is as follows:

$$|A, D\rangle = \frac{1}{\sqrt{8}}(|000, 000\rangle + |001, 101\rangle + |010, 000\rangle + |011, 000\rangle +$$
$$|100, 000\rangle + |101, 000\rangle + |110, 000\rangle + |111, 000\rangle).$$

Thus, in this first non-limiting example, the value |101⟩ is stored in the location |001⟩.

In a second non-limiting example, once address initialization is conducted (similar to that described in the first non-limiting example), a value |101⟩ is read from location/address |001⟩. In this second non-limiting example, the first n qubits of register |qy⟩ are loaded with the target location in the QRAM (e.g., circuit 100). Thus, the state of the register qubit |r⟩ to state |1⟩ to perform a reading operation. Thus, the state of the QRAM is:

$$|\psi_0\rangle = \frac{1}{\sqrt{8}}(|000, 000, 0, 001\ 000, 1\rangle + |001, 101, 0, 001\ 000, 1\rangle +$$
$$|010, 000, 0, 001\ 000, 1\rangle + |011, 000, 0, 001\ 000, 1\rangle + |100,$$
$$000, 0, 001\ 000, 1\rangle + |101, 000, 0, 001\ 000, 1\rangle + |110,$$
$$000, 0, 001\ 000, 1\rangle + |111, 000, 0, 001\ 000, 1\rangle).$$

In this second non-limiting example, an S operator (e.g., S gate 102) is applied between the first three qubits of register |qy⟩ and register |A⟩ to search for a designated location/address. Thus, the S operator transfer the designated location/address to state |111⟩ as follows:

$$|\psi_1\rangle = \frac{1}{\sqrt{8}}(|110.000, 0, 001\ 000, 1\rangle + |111, 101, 0, 001\ 000, 1\rangle +$$
$$|100.000.0, 001\ 000.1\rangle + |101, 000, 0, 001\ 000, 1\rangle +$$
$$|010, 000, 0, 001\ 000, 1\rangle + |011, 000, 0, 001\ 000, 1\rangle +$$
$$|000, 000, 0, 001\ 000, 1\rangle + |001, 000, 0, 001\ 000, 1\rangle).$$

In this second non-limiting example, another gate (e.g., gate 104B) is applied. Thus, this particular gate negates the state of the qubit |dq⟩ only if the state of the address register |A⟩ is in the state |A⟩=|111⟩ as follows:

$$|\psi_1\rangle = \frac{1}{\sqrt{8}}(|110.000.0.001\ 000.1\rangle + |111.101.1.001\ 000.1\rangle +$$
$$|100.000.0.001\ 000.1\rangle + |101.000, 0, 001\ 000.1\rangle +$$
$$|010, 000, 0, 001\ 000, 1\rangle + |011, 000.0, 001\ 000, 1\rangle +$$
$$|000, 000, 0, 001\ 000, 1\rangle + |001, 000, 0, 001\ 000, 1\rangle).$$

In this second non-limiting example, gates $C^0$–C–SW $AP_{rdqqy_{n+i}D_i}$ (i=1, 2, 3) (e.g., gate 104A) does not work because the state of qubit |r⟩ is |1⟩. Meanwhile, the gates $T_{rdqqy_{n+i}D_i}^3$ (C-C-NOT gate) work because they are controlled by state |r⟩ is |1⟩. Thus, the reading operation occurs as follows:

$$|\psi_2\rangle = \frac{1}{\sqrt{8}}(|110, 000, 0, 001\ 000, 1\rangle + |111, 101, 1, 001\ 101, 1\rangle +$$
$$|100, 000, 0, 001\ 000, 1\rangle + |101, 000, 0, 001\ 000, 1\rangle +$$
$$|010, 000, 0, 001\ 000, 1\rangle + |011, 000, 0, 001\ 000, 1\rangle +$$
$$|000, 000, 0, 001\ 000, 1\rangle + |001, 000, 0, 001\ 000, 1\rangle).$$

In this second non-limiting example, the QRAM undoes the effect of step 3 after the reading process is completed by applying the $T_{A_1A_2A_3dq}^3$ (e.g., Toffoli Gate 105), as follows:

In this second non-limiting example, the circuit undoes the effect of S gates 102 after the writing process is done by applying the S operator again (e.g., QHD 106). Thus:

$$|\psi_4\rangle = \frac{1}{\sqrt{8}}(|000, 000, 0, 001\ 000, 1\rangle + |001, 101, 0, 001\ 101, 1\rangle +$$
$$|010, 000, 0, 001\ 000, 1\rangle + |011, 000, 0, 001\ 000, 1\rangle +$$
$$|100, 000, 0, 001\ 000, 1\rangle + |101, 000, 0, 001\ 000, 1\rangle +$$
$$|110, 000, 0, 001\ 000, 1\rangle + |111, 000, 0, 001\ 000, 1\rangle).$$

In embodiments, |ψ⟩ represents the first n qubits of the register |qy⟩ in FIG. 1 and |φ⟩ represents the n qubits of the registers |A⟩. Thus, in this second non-limiting example, the state of register |qy⟩ has the following state:

$$|qy\rangle = \sqrt{\frac{7}{8}}|001,000\rangle + \frac{1}{\sqrt{8}}|001,101\rangle.$$

In embodiments, the first non-limiting example and the second non-limiting example shows how a proposed QRAM writes the value |101> in the location/address |001>, then how it reads this value from this location/address.

Figure 5:
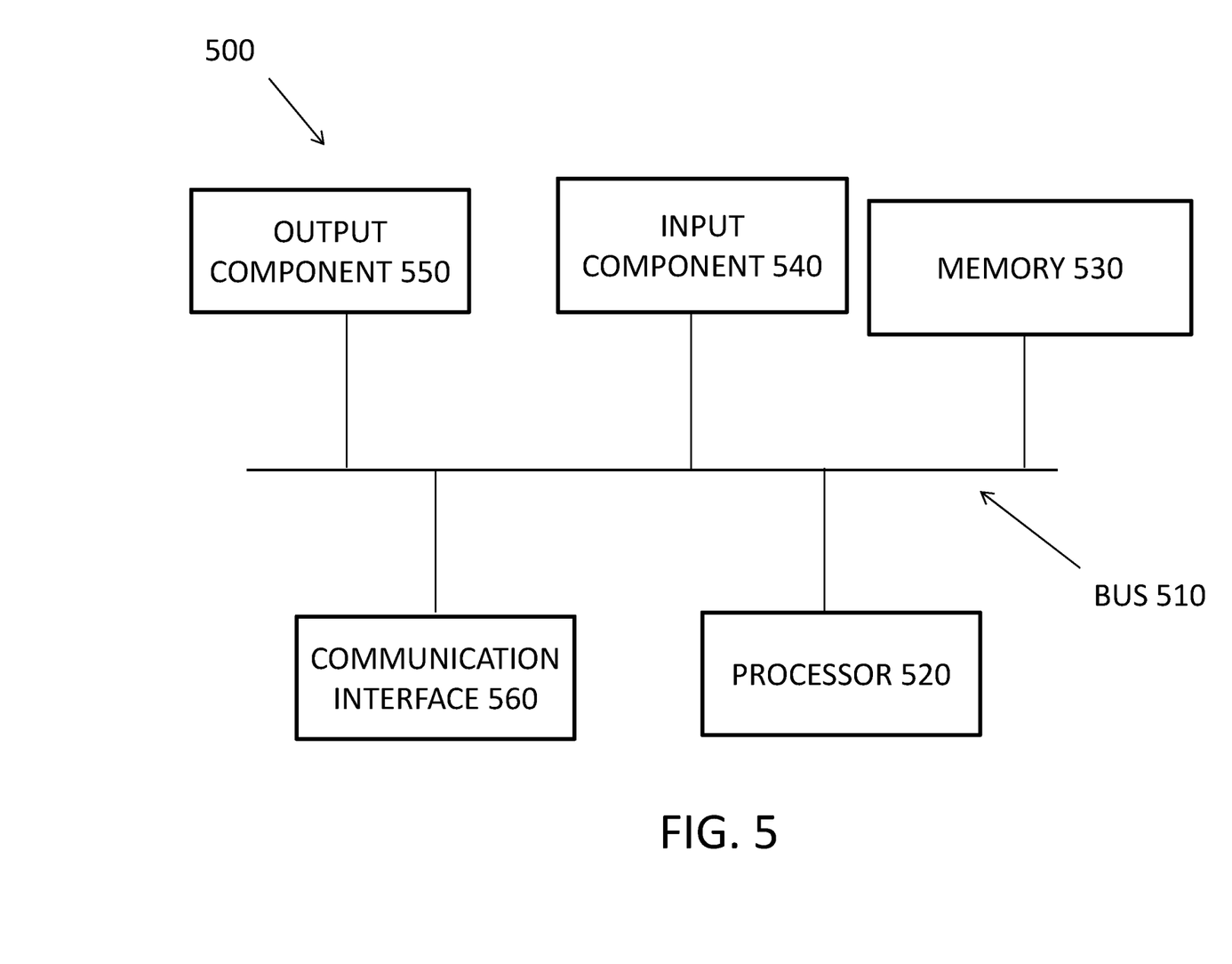
FIG. 5 is a diagram of an example device.

FIG. 5 is a diagram of example components of a device 500. Device 500 may correspond to a computing device, such as devices that may use circuit 100 (the proposed QRAM). As shown in FIG. 5, device 500 may include a quantum bus 510, a processor 520, a memory (QRAM) 530, quantum input component 540, quantum output component 550, and a communications interface 560. In other implementations, device 500 may contain fewer components, additional components, different components, or differently arranged components than depicted in FIG. 5. Additionally, or alternatively, one or more components of device 500 may perform one or more tasks described as being performed by one or more other components of device 500.

Bus 510 may include a path that permits communications among the components of device 500. Processor 520 may include one or more processors, microprocessors, and/or processing logic (e.g., a field programmable gate array (FPGA), quantum teleportation devices, quantum communication devices, quantum computing circuits, quantum encryption applications and/or an application specific integrated circuit (ASIC)) that interprets and executes instructions. Memory 530 may include the proposed QRAM circuit for use by processor 520. Input component 540 may include a mechanism that permits a user to convert classical information to quantum input information to device 500, such as a quantum circuit, a quantum-based application, a keyboard, a keypad, a button, a switch, voice command, etc. Output component 550 may include a mechanism that outputs information and transforms quantum information to classical information to be provided to the user, such as a display, a speaker, one or more light emitting diodes (LEDs), etc.

Communications interface 560 may include any transceiver-like mechanism that enables device 500 to communicate with other devices and/or systems. For example, communications interface 560 may include an Ethernet interface, an optical interface, a coaxial interface, a wireless interface, or the like and quantum-to-classical and vice versa unit.

In another implementation, communications interface 560 may include, for example, a transmitter that may convert baseband signals from processor 520 to radio frequency (RF) signals and/or a receiver that may convert RF signals to baseband signals. Alternatively, communications interface 560 may include a transceiver to perform functions of both a transmitter and a receiver of wireless communications (e.g., radio frequency, infrared, visual optics, quantum wireless, quantum channels, quantum fiber optics, quantum teleportation, quantum communication devices/networks, quantum encryption devices, etc.), wired communications (e.g., conductive wire, twisted pair cable, coaxial cable, transmission line, fiber optic cable, waveguide, single-photon channels, multi-photon channels, etc.), or a combination of wireless and wired communications.

Communications interface 560 may connect to an antenna assembly (not shown in FIG. 5) for transmission and/or reception of the RF signals, and/or quantum channels. The antenna assembly may include one or more antennas to transmit, quantum channels and/or receive RF signals over the air. The antenna assembly may, for example, receive RF signals and/or quantum information from communications interface 560 and transmit the RF signals over the air, and receive RF signals over the air and provide the RF signals to communications interface 560. In one implementation, for example, communications interface 560 may communicate with a network (e.g., a wireless network, quantum network, quantum channel, wired network, Internet, quantum internet, etc.). In embodiments, an antenna may be implemented by quantum teleportation protocols, quantum communication protocols and/or quantum encryption protocols.

As will be described in detail below, device 500 may perform certain operations. Device 500 may perform these operations in response to processor 520 executing software instructions (e.g., computer program(s), quantum computing circuit, quantum teleportation, etc.) contained in a computer-readable medium/quantum-based computing, such as memory 530, a secondary storage device (e.g., hard disk, CD-ROM, etc.), or other forms of RAM or ROM. In embodiments, a part of memory 530 may include circuit 100 as described in FIG. 1. A computer-readable medium may be defined as a non-transitory memory device. A memory device may include space within a single physical memory device or spread across multiple physical memory devices. The software instructions may be read into memory 530 from another computer-readable medium or from another device. The software instructions contained in memory 530 may cause processor 520 to perform processes described herein. Alternatively, hardwired circuitry may be used in place of or in combination with software instructions to implement processes described herein. Thus, implementations described herein are not limited to any specific combination of hardware circuitry and software.

Figure 6:
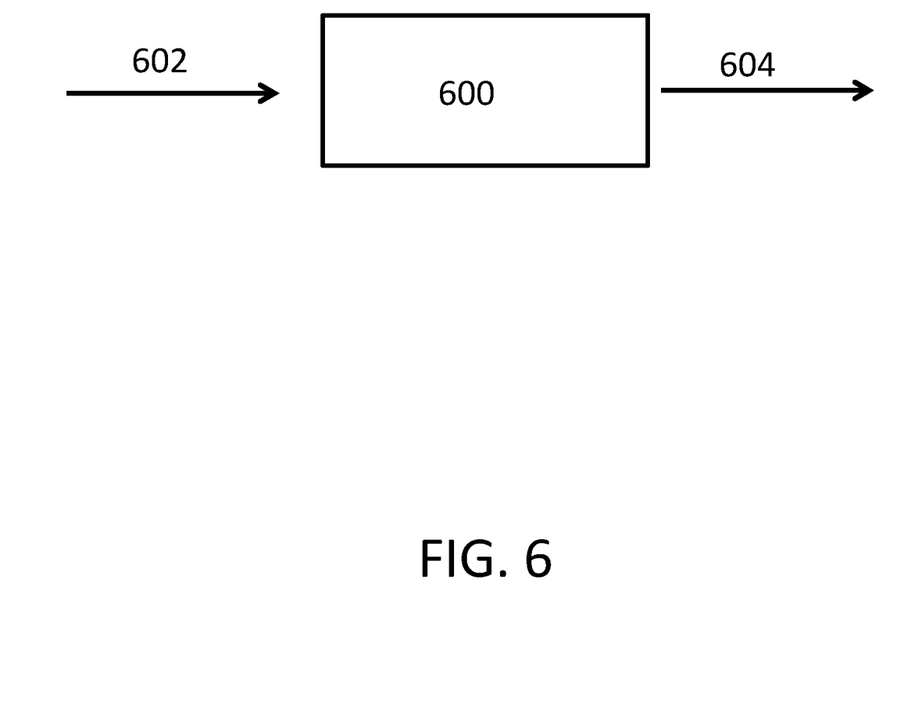
FIG. 6 is a diagram of an example process.

FIG. 6 is an example diagram. FIG. 6 describes device 600, input 602, and output 604. In embodiments, device 600 may a computing device with features/structures similar to that described in FIG. 6. In embodiments, device 600 may be a computing device that is part of a laptop, desktop, tablet, smartphone, quantum computer, quantum computing device, quantum communication device, quantum teleportation device, quantum encryption device, quantum internet device, and/or any other device. In embodiments, device 600 may include a QRAM (e.g., circuit 100) similar to that described the above figures.

In embodiments, device 600 may receive communication 602, analyze communication 602, and generate output 604. In embodiments, based on the QRAM in device 600, output 604 which gives a writing fidelity of 99.9971% and a reading fidelity of 99.983% which mean that the QRAM may have a 99.980% accuracy in the information in output 604.

Even though particular combinations of features are recited in the claims and/or disclosed in the specification, these combinations are not intended to limit the disclosure of the possible implementations. In fact, many of these features may be combined in ways not specifically recited in the claims and/or disclosed in the specification. Although each dependent claim listed below may directly depend on only one other claim, the disclosure of the possible implementations includes each dependent claim in combination with every other claim in the claim set.

While various actions are described as selecting, displaying, transferring, sending, receiving, generating, notifying, and storing, it will be understood that these example actions are occurring within an electronic computing, electronic networking, quantum computing and/or quantum networking environment and may require one or more computing devices, as described in FIG. 5 to complete such actions. Furthermore, it will be understood that these various actions can be performed by using a touch screen on a computing device (e.g., touching an icon, swiping a bar or icon), using a keyboard, a mouse, or any other process for electronically selecting an option displayed on a display screen to electronically communicate with other computing devices, quantum computer, cloud quantum circuit/computer, quantum communication devices, quantum teleportation devices, quantum encryption circuit/devices, and/or quantum networks. Also it will be understood that any of the various actions can result in any type of electronic information and/or quantum information to be displayed in real-time and/or simultaneously on multiple user devices. For FIGS. 3 to 6, any electronic graphs and/or quantum information may be generated by a computing device, such as device 500, and displayed via a graphical user device (GUI) or cloud environment.

No element, act, or instruction used in the present application should be construed as critical or essential unless explicitly described as such. Also, as used herein, the article "a" is intended to include one or more items and may be used interchangeably with "one or more." Where only one item is intended, the term "one" or similar language is used. Further, the phrase "based on" is intended to mean "based, at least in part, on" unless explicitly stated otherwise. Also, the phrase "converted text," or "converted information" may indicate information that has been converted from handwritten or non-handwritten information to printed information. The phrase "information" may indicate letters, words, numbers, and/or symbols. The phrase "text" may indicate letters, numbers, and/or symbols. The phrases "information" and "text" may indicate the same thing, i.e., letters, numbers, and/or symbols. Also, while the above examples are associated with prescriptions, pharmacists, and doctors, the above example actions may also be used for other scenarios and analysis of other types of handwritten text, such as with purchase orders, shipping orders, etc.

In the preceding specification, various preferred embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A quantum digital circuit, comprising:
a first Toffoli gate;
a S gate;
a SWAP gate; and
a second Toffoli gate.

2. The quantum digital circuit of claim 1, wherein the second Toffoli gate is located after the first Toffoli gate.

3. The quantum digital circuit of claim 1, wherein the S gate includes one or more CNOT gates and a quantum X-gate.

4. The quantum digital circuit of claim 3, wherein the one or more CNOT gates operate as a two qubit gate.

5. The quantum digital circuit of claim 1 wherein the first Toffoli gate is a reversible quantum gate.

6. The quantum digital circuit of claim 1, further comprising:
an additional S gate, wherein the additional S gate undoes the effect of the S gate.

7. The quantum digital circuit of claim 1, further comprising:
one or more Hadamard gates, wherein the one or more Hadamard gates are a one qubit version of a quantum Fourier transform.

8. An electronic communications method, comprising:
receiving, by one or more Hadamard gates, one or more qubits;
applying, by the one more Hadamard gates, an algorithm to one or more qubits to address 2n locations in a quantum random access memory (QRAM)
searching, by a S gate, an address location in the 2n locations;
assigning, by a quantum processor, by first n qubits of the one or more qubits of the register |gy>;
marking, by a Toffoli gate, an address which matches the address location associated with the register |qy>;
applying, by a SWAP gate or another Toffoli gate, a value to the first n qubits;
removing, by a third Toffoli gate, a marking entangled over qubit |dq>, and
applying, by another S gate, to the one more qubits to undo the effect of the S gate.

9. The electronic communications method of claim 8, wherein if a qubit |r> is loaded with state |1>, then the other Toffoli gate is in operation and a reading process is occurring.

10. The electronic communications method of claim 8, wherein if a qubit |r> is loaded with state |0>, the SWAP gate is in operation is in operation and a writing process is occurring.

11. The electronic communications method of claim 10, wherein the SWAP gate writes a value stored in last m qubits of register |qy> into a QRAM location specified by the first n qubits.

12. The electronic communications method of claim 8, wherein the S gates conduct search operations after the one or more Hadamard gates apply the algorithm.

13. The electronic communications method of claim 12, wherein the one or more Hadamard gates are located before the S gate and the Toffoli gate.

* * * * *

UNITED STATES PATENT AND TRADEMARK OFFICE
CERTIFICATE OF CORRECTION

| | | |
|---|---|---|
| PATENT NO. | : 11,651,266 B2 | Page 1 of 1 |
| APPLICATION NO. | : 17/402620 | |
| DATED | : May 16, 2023 | |
| INVENTOR(S) | : Hichem El Euch et al. | |

It is certified that error appears in the above-identified patent and that said Letters Patent is hereby corrected as shown below:

On the Title Page

Item (72) Correct one of the inventor's names:
ABDULHALEEM MOHAMED AHMED ABDELATY
To:
ABDELHALEEM MOHAMED AHMED ABDELATY Signed and Sealed this
Fourth Day of July, 2023

Katherine Kelly Vidal
*Director of the United States Patent and Trademark Office*